United States Patent
Crippa et al.

(10) Patent No.: US 10,228,392 B2
(45) Date of Patent: Mar. 12, 2019

(54) CONTACT PROBE FOR A TESTING HEAD

(71) Applicant: TECHNOPROBE S.P.A., Cernusco Lombardone (IT)

(72) Inventors: Roberto Crippa, Cernusco Lombardone (IT); Giuseppe Crippa, Cernusco Lombardone (IT); Raffaele Vallauri, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 193 days.

(21) Appl. No.: 15/352,448

(22) Filed: Nov. 15, 2016

(65) Prior Publication Data

US 2017/0059612 A1   Mar. 2, 2017

Related U.S. Application Data

(63) Continuation-in-part of application No. PCT/EP2016/055023, filed on Mar. 9, 2016.

(30) Foreign Application Priority Data

Mar. 13, 2015  (IT) .............................. MI2015A0382

(51) Int. Cl.
| | | |
|---|---|---|
| *G01R 1/067* | (2006.01) | |
| *H01R 13/03* | (2006.01) | |
| *H01R 13/24* | (2006.01) | |
| *G01R 1/073* | (2006.01) | |

(52) U.S. Cl.
CPC ..... *G01R 1/06738* (2013.01); *G01R 1/06755* (2013.01); *G01R 1/06761* (2013.01); *G01R 1/073* (2013.01); *G01R 1/07357* (2013.01); *H01R 13/03* (2013.01); *H01R 13/2464* (2013.01); *G01R 1/06716* (2013.01); *G01R 1/07314* (2013.01)

(58) Field of Classification Search
CPC ........... G06K 7/10465; G06K 7/10356; G06K 7/10336; G06K 7/10346; G01N 27/72
USPC ...................... 324/200, 207.3, 244, 253, 254
See application file for complete search history.

(56) References Cited

U.S. PATENT DOCUMENTS

| | | | | |
|---|---|---|---|---|
| 6,617,972 B2 * | 9/2003 | Takarada | ........... | G08B 21/0484 324/538 |
| 8,779,729 B2 * | 7/2014 | Shiraishi | ............ | G01R 31/3606 320/155 |
| 2006/0217906 A1 * | 9/2006 | Barbara | .................... | G01R 1/36 702/60 |
| 2010/0281854 A1 * | 11/2010 | Huang | ................ | F02D 41/1495 60/276 |

(Continued)

*Primary Examiner* — Giovanni Astacio-Oquendo

(74) *Attorney, Agent, or Firm* — Seed IP Law Group LLP

(57) ABSTRACT

A contact probe of a testing head of a testing apparatus of electronic devices comprises respective end portions adapted to contact respective contact pads and a body essentially extended in a longitudinal direction between the end portions, at least one end portion comprising an insert made of a first conductive material having a hardness being greater than a second conductive material making the contact probe which is supported by a section of the end portion, the section being made of the second conductive material and being shaped in a complementary way with respect to the insert and having respective abutting surfaces facing and adhering to respective abutting surfaces of the insert.

36 Claims, 11 Drawing Sheets

(56) References Cited

U.S. PATENT DOCUMENTS

| | | | |
|---|---|---|---|
| 2012/0098518 A1* | 4/2012 | Unagami | G01R 22/066 324/74 |
| 2012/0182023 A1* | 7/2012 | Zhang | G01M 11/3109 324/501 |
| 2012/0286816 A1 | 11/2012 | Kister | |
| 2014/0320159 A1 | 10/2014 | Lee | |
| 2015/0015287 A1 | 1/2015 | DeBauche et al. | |

* cited by examiner

CONTACT PROBE FOR A TESTING HEAD

BACKGROUND

Technical Field

The present disclosure refers to a contact probe for a testing head.

The disclosure refers in particular, but not exclusively, to a contact probe of a testing head of a testing apparatus of electronic devices integrated on wafers and the following description is made with reference to this field of application with the only purpose of simplifying its exposition.

Description of the Related Art

As is known, a testing head (probe head) is a device adapted to place a plurality of contact pads of a microstructure, in particular an electronic device that is integrated on a wafer, into electrical contact with corresponding channels of a testing machine performing the working test thereof, in particular the electrical test, or generically the test.

The test, which is performed on integrated devices, is particularly useful to detect and isolate defective devices yet in the manufacturing step. Generally, the testing heads are thus used to electrically test the devices that are integrated on a wafer before cutting and assembling them inside a chip containing package.

A testing head usually comprises a large number of contact elements or contact probes made of wires of special alloys having good electrical and mechanical properties and provided with at least one contact portion for a corresponding plurality of contact pads of a device to be tested.

A testing head comprising vertical probes, which is usually called "vertical probe head", comprises a plurality of contact probes retained by at least one pair of plates or guides, which are substantially plate-shaped and parallel to each other. Those guides are provided with suitable holes and are arranged at a certain distance from each other so as to leave a free space or air gap for the movement and the possible deformation of the contact probes. The pair of guides comprises in particular an upper guide and a lower guide, both provided with respective guide holes where the contact probes axially slide, the probes being usually made of wires of special alloys having good electrical and mechanical properties.

The good connection between the contact probes and the contact pads of the device to be tested is realized by pressing the testing head on the device itself, the contact probes, which are movable within the guide holes made in the upper and lower guides, undergoing a bending inside the air gap between the two guides and sliding within such guide holes during that pressing contact.

Furthermore, the bending of the contact probes in the air gap can be assisted by means of a suitable configuration of the probes themselves or of their guides, as schematically shown in FIG. 1, wherein, for sake of illustration simplicity, only one contact probe of the plurality of probes usually included in a testing head has been shown, the shown testing head being of the so-called shifted plates type.

In particular, FIG. 1 schematically shows a testing head 1 comprising at least one upper plate or guide 2 and one lower plate or guide 3, having respective upper guide hole 2A and lower guide hole 3A where at least one contact probe 4 slides.

The contact probe 4 has at least one contact end or contact tip 4A. Here and in the following, the terms end or tip mean an end portion, not necessarily being sharp. In particular the contact tip 4A abuts onto a contact pad 5A of a device to be tested 5, realizing the mechanical and electrical contact between that device and a testing apparatus (not shown) of which such testing head is a terminal element.

In some cases, the contact probes are fixedly fastened to the head itself in correspondence of the upper guide: in such case, the testing heads are referred to as blocked probe testing heads.

Alternatively, testing heads having probes not fixedly fastened are used, those probes being interfaced to a board by means of a micro-contact board; those testing heads are referred to as non-blocked probe testing heads. The micro-contact board is usually called "space transformer" since, besides contacting the probes, it also allows to spatially redistribute the contact pads made on it with respect to the contact pads of the device to be tested, in particular relaxing the distance constraints between the centers of the pads themselves.

In this case, as illustrated in FIG. 1, the contact probe 4 has a further contact tip 4B, which in this technical field is referred to as contact head, towards a plurality of contact pads 6A of such a space transformer 6. The good electrical contact between probes and space transformer is guaranteed in a similar manner to the contact with the device to be tested by pressing the contact heads 4B of the contact probes 4 against the contact pads 6A of the space transformer 6.

As already explained, the upper 2 and lower 3 guides are suitably spaced by an air gap 7 which allows the deformation of the contact probes 4 and ensures the contact of the contact tip and of the contact head of the contact probes 4 with the contact pads of the device to be tested 5 and of the space transformer 6, respectively. Obviously, the upper 2A and lower 3A guide holes are sized so as to allow a sliding movement of the contact probe 4 therein.

In fact, it should be remembered that the correct operation of a testing head is basically linked to two parameters: the vertical movement, or overtravel, of the contact probes and the horizontal movement, or scrub, of the contact tips of such probes.

These characteristics are therefore evaluated and calibrated in the manufacturing step of a testing head, the good electrical connection between the probes and the device to be tested being so guaranteed.

It is also possible to realize a testing head having contact probes protruding from a support, usually made of a ceramic material, possibly suitably preformed so as to ensure a proper bending thereof during the contact with the pads of a device to be tested. Such probes are further deformed when contacting the pads of the device to be tested.

The increase of the packing density of the probes required by the most modern technologies of integration on wafers involves problems of contact between adjacent probes, in particular during their deformation during the operation of the testing head.

In order to ensure a correct orientation of the probes, and in particular of their deformed sections, and therefore also of their deformation, it is known to realize contact probes having non-circular section, and in particular rectangular, and testing heads with guides having respective guide holes in turn having non-circular section, in particular rectangular, keeping the contact probes in position during their contact with the contact pads of the device to be tested and their consequent further deformation.

It is convenient to emphasize that the end portions of contact probes 4, at the contact head and contact tip 4A and 4B and in particular comprising the portions of the probes that are apt to slide in the guide holes 2A and 3A, are normally made so as to be tilted with respect to the axes of these holes (usually orthogonal to a plane defined by the device to be tested), in order to ensure the desired scrub on the contact pads.

The inclination of the end portions of the contact probes with respect to the axes of the guide holes then creates one or more points of contact between probes and holes, so as to realize an at least partial retention of the probes inside the holes.

It happens, however, that the retention of the probes, and in particular of their end portions, inside the guide holes is sometimes excessive, which limits the freedom of sliding of the probes themselves and affecting the proper operation of the testing head as a whole. In extreme conditions, the contact probes can "get stuck" inside the guide holes, completely stopping any operation of the testing head and leading to the need to replace it.

To ensure a correct sliding of the probe inside a relative guide hole as well as a proper hold in position of the probes inside the guides, while minimizing the risk that the probes get stuck and thus the need to replace the head, it is known to coat the end portions of the contact probes 4 with layers of a conductive material having a greater hardness than that of the conductive material forming the rest of the contact probe.

In particular, the coating layers extend in correspondence of a terminal portion of the respective end portion, from a tip up to the full height of the respective guide hole.

However, conductive materials with high hardness have also a marked fragility and can be made only in the form of films of reduced thickness, for example between 0.01 microns and 5 microns.

U.S. patent application published under No. US 2012/0286816, teaches to use conductive materials with high hardness for producing thin plates protruding from the body of the contact probes at their end portions. These plates, which are very resistant and able to penetrate a possible oxide layer which covers the contact pads, also allow in particular to make contact with the so-called bump, i.e. of conductive elements protruding from a device to be tested as contact portions, as it happens in other embodiments for the contact pads.

In some cases, a central portion of the contact probe is also coated with a layer of insulating material, such as parylene, apt to improve the electrical insulation of the probes, in particular avoiding short circuits in the event of accidental contacts between adjacent contact probes.

Noble metals coatings, in particular palladium-based noble metals coatings, of the end portions of the contact probes are also used to improve the contact of the end portions with respective contact pads, the materials forming the contact probes having in fact contact problems, in particular by varying the operating temperatures of the testing head including the contact probes.

BRIEF SUMMARY

An embodiment of the present disclosure is directed to a contact probe having at least one end portion made of at least one conductive material having a greater hardness value than a conductive material that forms a body of the contact probe and being able to improve the contact of the end portions with respective contact pads, and at the same time avoiding the breakage of the end portion, so as to overcome the limitations and drawbacks currently affecting the testing heads made according to the prior art.

The contact probe has at least one end portion provided with an insert made of a conductive material with a greater hardness value than a conductive material forming the contact probe, such an insert being supported by at least one section of the end portion made of the same material forming the contact probe.

The contact probe of a testing head of a testing apparatus of electronic devices comprises respective end portions adapted to contact respective contact pads and a body extended in a longitudinal direction between the end portions, at least one end portion comprising an insert made of a first conductive material having a hardness greater than a second conductive material which forms the contact probe, the insert being supported by a section of the end portion, the section being made of the second conductive material and being shaped in complementary way with respect to the insert and having respective abutting surfaces facing and adhering to respective abutting surfaces of the insert.

Another embodiment of the present disclosure is directed to a contact probe of a testing head of a testing apparatus of electronic devices comprising:

respective end portions adapted to contact respective contact pads a body extended in a longitudinal direction between the respective end portions and having a height in a direction orthogonal to the longitudinal direction an insert comprised into at least one end portion and supported by a section thereof the section of the end portion is shaped in a complementary way with respect to the insert and has respective abutting surfaces facing and adhering to respective abutting surfaces of the insert wherein the insert is made of a first conductive material and the contact probe, the end portion and the section thereof are made of a second conductive material, the first conductive material having a hardness being greater than a hardness of a second conductive material; and the insert and the section have respective free end surfaces forming a contact area of the contact probe.

BRIEF DESCRIPTION OF THE SEVERAL VIEWS OF THE DRAWINGS

The characteristics and the advantages of the contact probe according to the disclosure will result from the following description of one embodiment thereof, given by way of an indicative and non-limiting example with reference to the annexed drawings.

In the drawings.

DETAILED DESCRIPTION

The following discussion is presented to enable a person skilled in the art to make and use the disclosure. Various modifications to the embodiments will be readily apparent to those skilled in the art, and the generic principles herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Figure 2A:
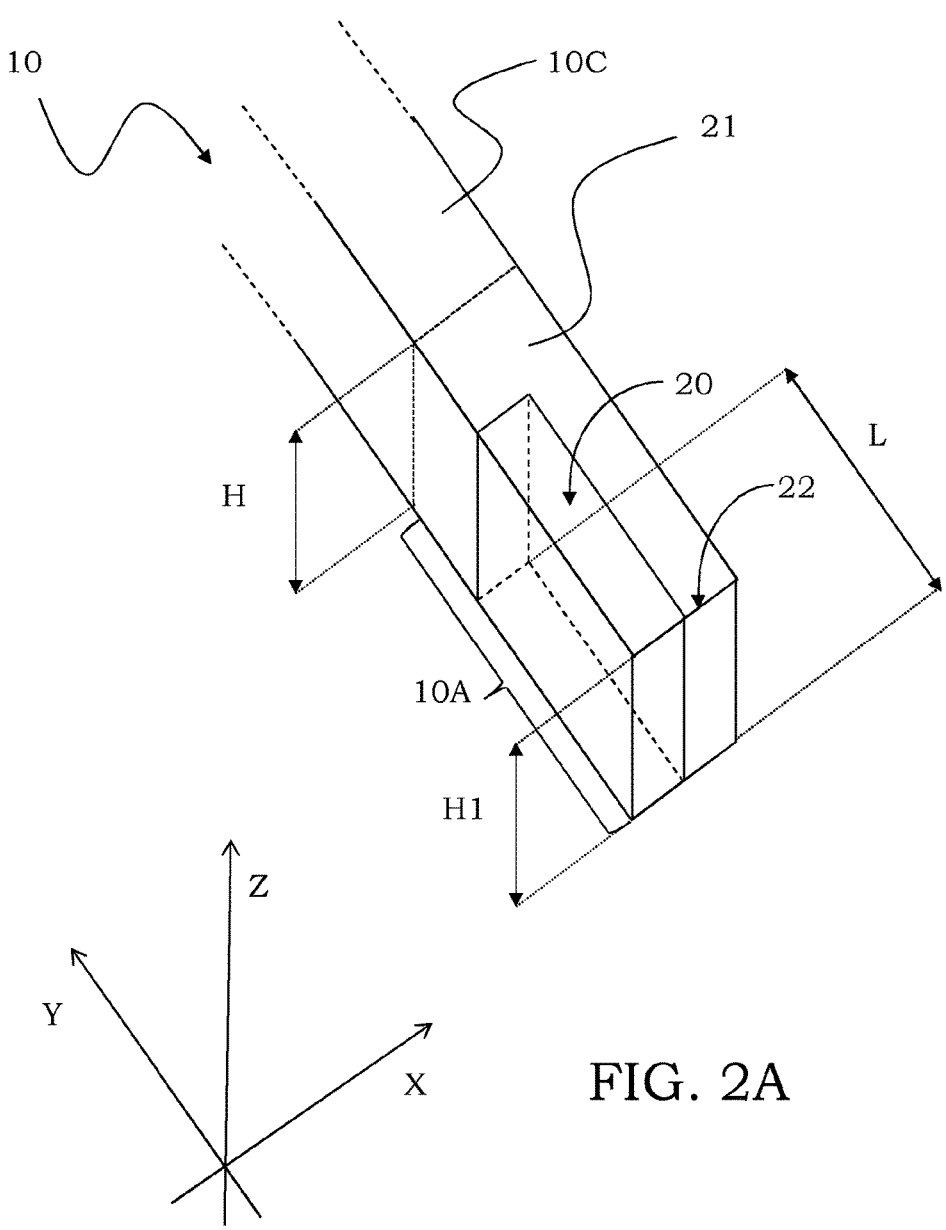
FIGS. 2A and 2B schematically show an embodiment of a contact probe according to the present disclosure, in a perspective and exploded views, respectively.

Referring to FIG. 2A, a contact probe for a testing head of a testing apparatus of electronic devices integrated on wafers is described, the contact probe being globally indicated with 10.

It should be noted that the Figures represent schematic views of the contact probe according to the embodiments of the disclosure and are not drawn to scale, but instead are drawn so as to emphasize the important features of the embodiments. In the Figures, the different pieces are shown schematically, as their shape can vary depending on the desired application.

In particular, referring to FIG. 2A, end portion 10A of the contact probe 10 comprises at least one contact tip apt to abut onto a contact pad of a device to be tested, which is not shown. The contact probe 10 has a configuration that can be used in a so called vertical probe testing head, such as the one illustrated in FIG. 1 in relation to the prior art, or any other form used in the technical field, ending with an end portion 10A apt to make contact with a contact pad, for instance of a device to be tested, as in the case of a contact tip, or can be a contact pad of a space transformer, as in the case of a contact head.

Figure 1:
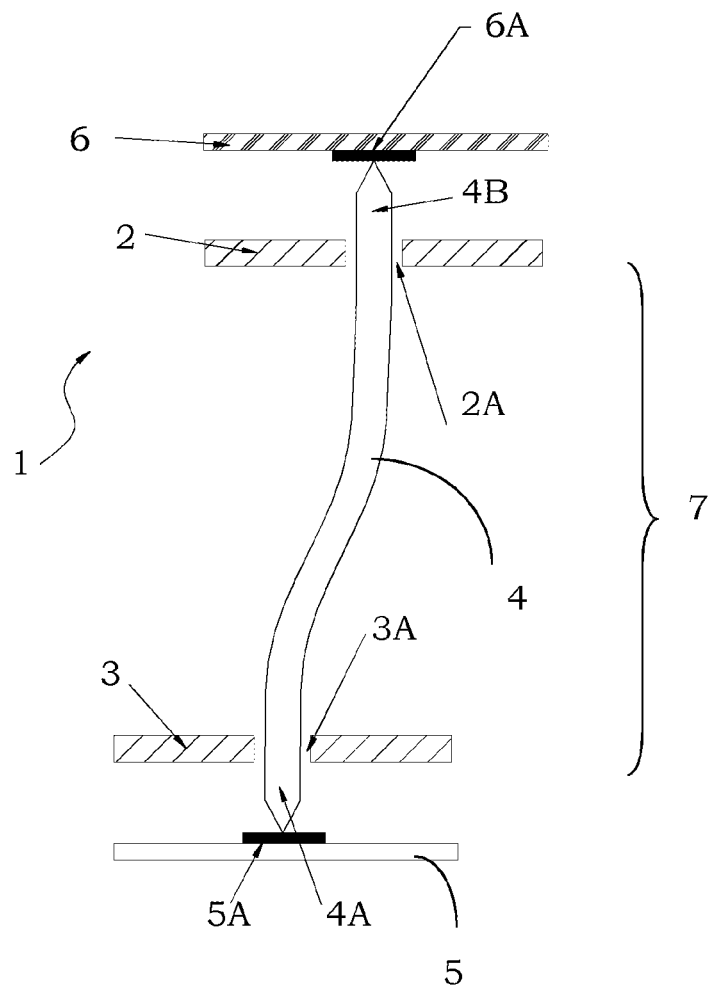
FIG. 1 schematically shows a contact probe for a testing head having vertical probes according to the prior art.

Considering the end portion 10A as a contact tip, the contact probe 10 of FIG. 1 also comprise a further end portion, in particular a contact head (not shown), having the same or a different shape compared to the contact tip, the contact head being intended to abut onto a contact pad of a space transformer, as in the case of non-blocked probes. Alternatively, the contact head is fixedly associated to a ceramic support, for example by welding, as in the case of blocked probes protruding from that support.

The contact probe 10 also comprises a body 10C extended in a longitudinal direction between the end portions, in particular between the contact tip and the contact head, that direction being indicated with Y in FIG. 2A.

According to an embodiment of the disclosure, at least one end portion 10A of the contact probe 10, for example the contact tip, comprises an insert 20, which is supported by a section 21 of such end portion 10A.

Figure 2B:
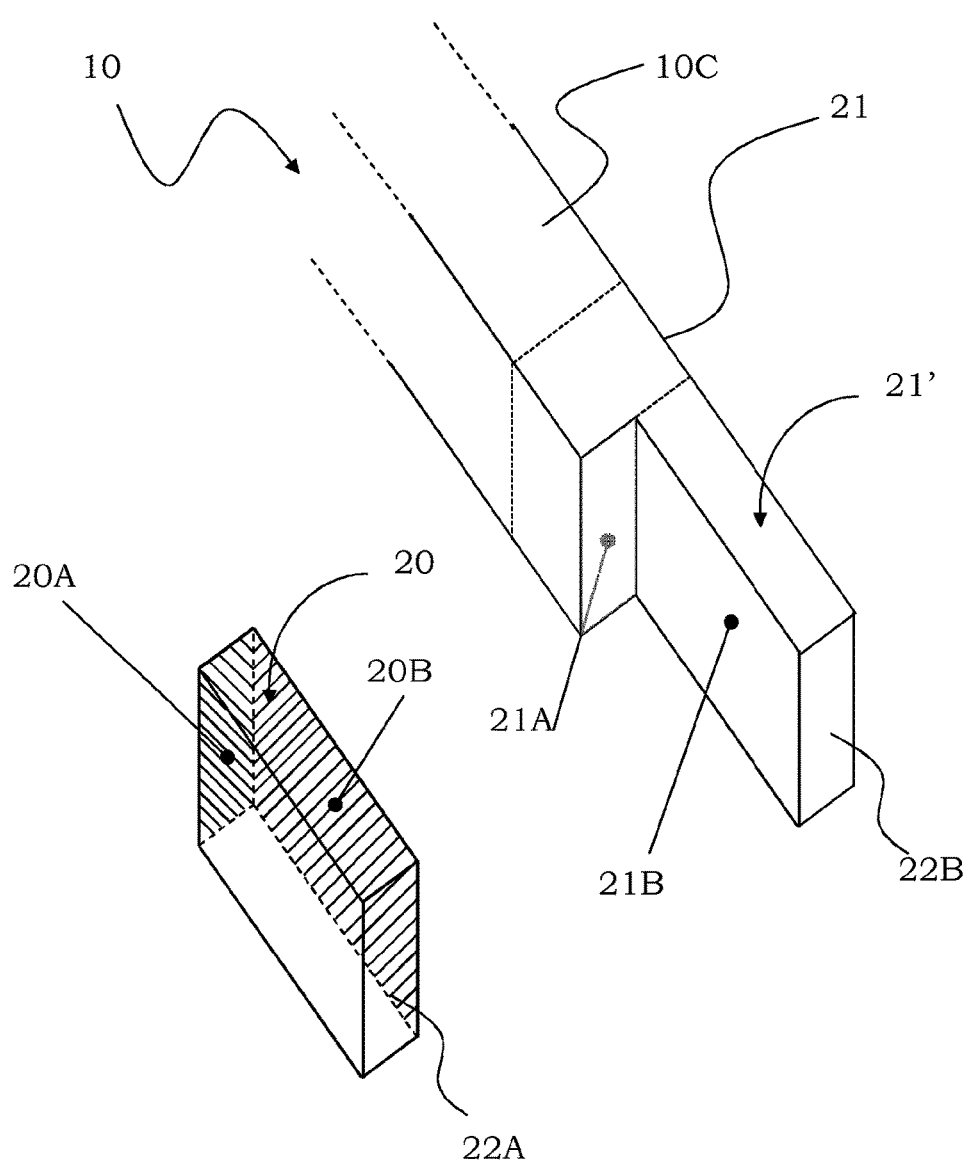

More particularly, referring to FIG. 2B, the section 21 is shaped so as to have at least one first abutting surface 21A and one second abutting surface 21B abutting and contacting, respectively, a first abutting surface 20A and a second abutting surface 20B of the insert 20. The section 21 comprises a laminar portion 21' (i.e. a thin plate portion) forming a support for abutting the insert 20.

The insert 20 and the section 21 have respective free end surfaces 22A and 22B, forming a contact area 22 of the contact probe 10, as indicated in FIG. 2A.

In particular, the first abutting surface 20A of the insert 20 is a surface arranged at the bottom of the insert 20 along the longitudinal direction Y, considering as starting point the contact area 22 of the contact probe 10, while the second abutting surface 20B of the insert 20 is a lateral surface along a transverse direction indicated with X in FIG. 2A, in particular it is a right lateral surface according to the local reference system of the Figure.

The insert 20 has a length L according to the longitudinal direction Y with a value between 10 μm and 1000 μm and a height H1 according to the orthogonal direction Z, also indicated in FIG. 2A, equal to a height H of the contact probe 10 and with a value between 20 μm and 100 μm.

Referring to FIG. 2A, the insert 20 is in particular positioned at one corner of the contact probe 10 and has further exposed surfaces, in particular an upper surface, a lower surface and a left lateral surface, still considering the local reference system of the Figure.

Suitably, the insert 20 is made of a first conductive material having a hardness greater than a second conductive material, which the contact probe 10 is made of, and in particular which the body 10C and the end portion 10A of the contact probe 10, more particularly the section 21, are made of.

The first conductive material is a metal or a metal alloy and can be rhodium, platinum, iridium or a metal alloy thereof, or a palladium-cobalt alloy, a palladium-nickel alloy or a nickel-phosphorous alloy. In a preferred embodiment of the disclosure, the first conductive material is rhodium.

Furthermore, the second conductive material is a metal or a metal alloy, for example nickel or an alloy thereof, such as a nickel-manganese alloy, a nickel-cobalt alloy or a nickel-tungsten alloy, copper or an alloy thereof, palladium or an alloy thereof. In a preferred embodiment of the disclosure, the second conductive material is nickel-tungsten.

It should be underlined in particular that, by virtue of its shape and of the materials used, the section 21 of the end portion 10A realizes a mechanical support for the insert 20, the second conductive material of the section 21 being less fragile than the first conductive material of the insert 20 and the section 21 being shaped so as to have a complementary shape to the insert 20.

In the exemplary embodiment illustrated in the Figures, the contact probe 10 has a substantially rectangular section. Obviously the contact probe 10 could have a section of any prismatic shape.

Figure 3:
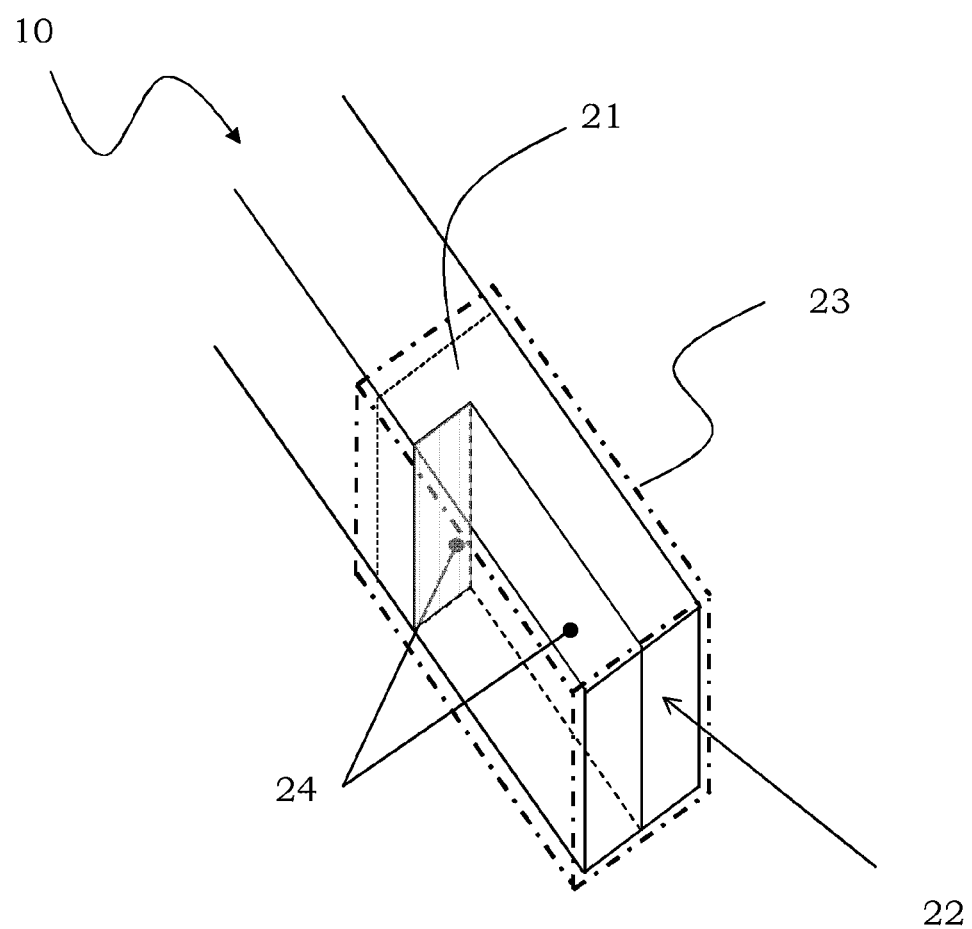
FIGS. 3, 4A-4C, 5, 6A-6D, 7A-7B, 8 and 9 schematically show a perspective view of alternative embodiments of a contact probe according to the present disclosure.

Suitably, referring to FIG. 3, the contact probe 10 further includes at least one coating layer 23, which extends at the end portion 10A, in order to cover at least the section 21 and the insert 20. According to an embodiment, the coating layer 23 can be such that the contact area 22 of the contact probe 10 emerges, i.e. the free end surface 22A of the insert 20 and the free end surface 22B and of the section 21, respectively emerge.

The coating layer 23 can be made of a conductive alloy having a low internal stress, such as a nickel alloy, able to improve the mechanical performances of the end portion 10A of the contact probe 10.

Suitably, the coating layer 23 also maintains the insert 20 in position, with the abutting surfaces 20A and 20B adhering to respective abutting surfaces 21A and 21B of the section 21. In practice, the coating layer 23 acts as a containment sock of the insert 20 and of the section 21.

Furthermore, by using a coating layer 23 having high hardness values, the working life of the probe is increased, thus guaranteeing its correct operation for a large number of testing operations where the end portion 10A of the contact probe 10 is in pressing contact on the contact pads of a device to be tested and even in the presence of a large number of cleaning and reshaping operations which usually involve abrasive cloths. Additionally, the coating layer 23 can be made of a conductive alloy having a high wear resistance, in particular having high hardness values, so as to limit the wear of a lower guide of the testing head, in particular of respective guide holes where the contact probes axially slide. In this case, the coating layer 23 is formed so as to extend for the entire thickness of the lower guide, i.e. up to its surface within the testing head, in particular within its air gap.

Suitably, such cleaning operations performed on abrasive cloths also allow to eliminate the coating layer 23 in correspondence of the contact area 22, letting the free end surface 22A of the insert 20 and the free end surface 22B of the section 21, respectively, emerge.

According to an alternative embodiment, the contact probe 10 further comprises at least one adhesion film 24 arranged on the abutting surfaces 20A and 20B, and 21A and 21B, respectively, between the insert 20 and the section 21 of the end portion 10A of the contact probe 10.

In particular, the adhesion film 24 can be made of a metal or a metal alloy, such as nickel or a nickel alloy, so as to improve the adhesion of the insert 20 on the section 21. Alternatively, the adhesion film 24 can be made of gold, silver, platinum or a metal alloy thereof, preferably gold.

As is known in the field, the term "film" means a layer having a thickness between 0.01 and 0.5 μm.

Referring to the embodiments of FIGS. 2A, 2B and 3, only by way of non-limiting example, the insert 20 has a height H1 substantially corresponding to the height H of the contact probe 10 and of the section 21 supporting that contact probe 10, in particular of its thin plate portion 21'.

Figure 4:
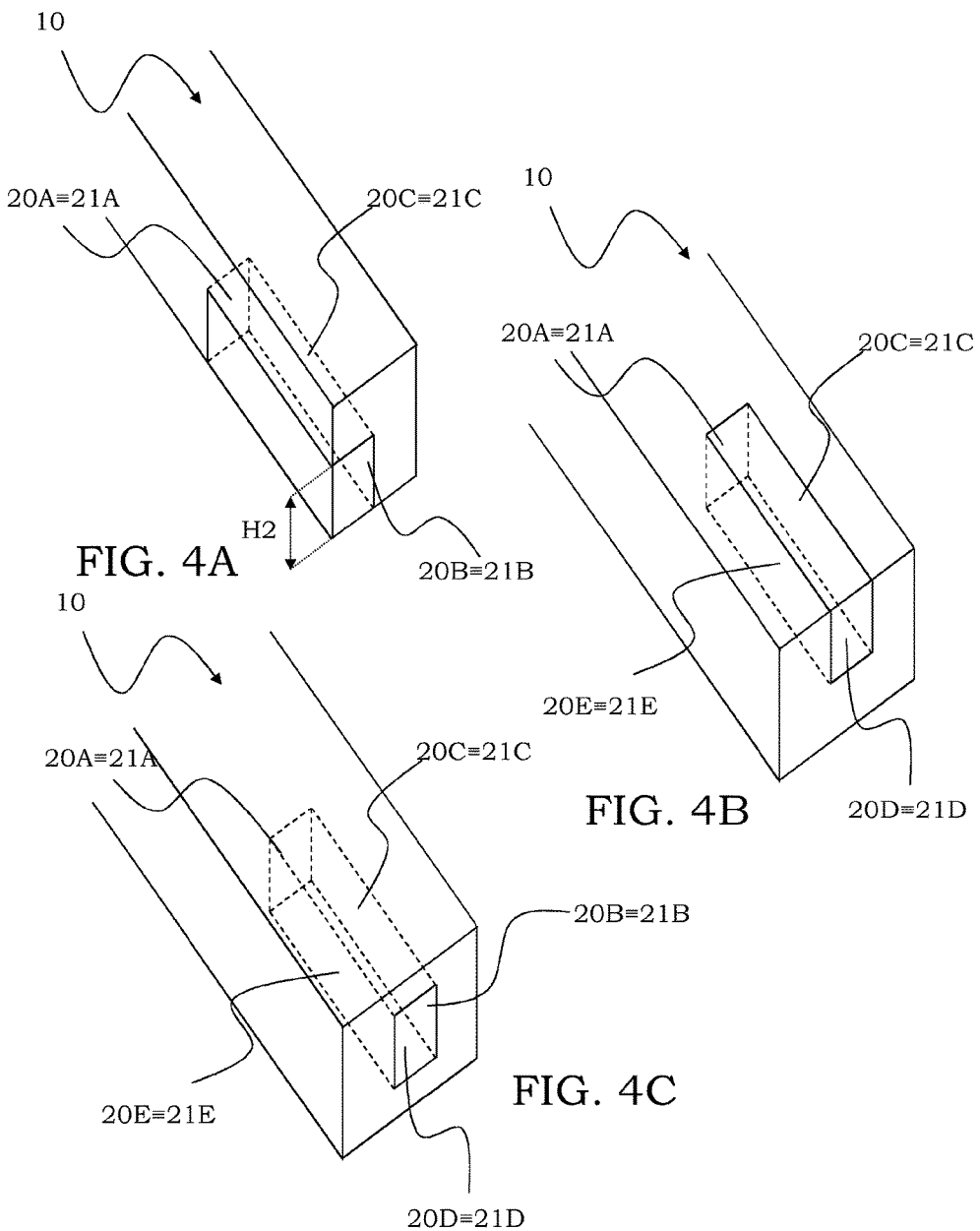

Alternatively, referring to FIGS. 4A-4C, the insert 20 has a height H2 lower than the one of the contact probe 10.

Such height H2 of the insert 20 is for example equal to 20%-80% of the height H of the contact probe 10, preferably equal to 50%. More particularly, the height H2 can have a value from 3 μm to 50 μm.

It is possible to consider the insert 20 arranged at one corner of the contact probe 10; in this case, the insert 20 and the section 21 supporting that insert 20 have at least respective third abutting surfaces 20C and 21C adhering to each other, as shown schematically in FIG. 4A. In particular, the third abutting surface 20C of the insert 20 is an upper surface, by considering the local reference system of the Figure.

Alternatively, the insert 20 can be arranged at only one side of the contact probe 10; in this case, the insert 20 and the section 21 supporting that insert 20 have at least respective fourth and fifth abutting surfaces, 20D, 21D and 20E, 21E, as shown schematically in FIG. 4B. In particular, the fourth abutting surface 20D of the insert 20 is a lower surface and the fifth abutting surface 20E of the insert 20 is a left lateral surface, by considering the local reference system of the Figure.

Furthermore, the insert 20 can be positioned so as to be completely embedded in the contact probe 10; in this case, the insert 20 and the section 21 supporting the insert 20 have respective third, fourth and fifth abutting surfaces 20C, 20D and 20E, as shown schematically in FIG. 4C.

In any case, the insert 20 has at least one free end surface 22A, emerging in correspondence of the contact area 22 of the contact probe 10.

Figure 5:
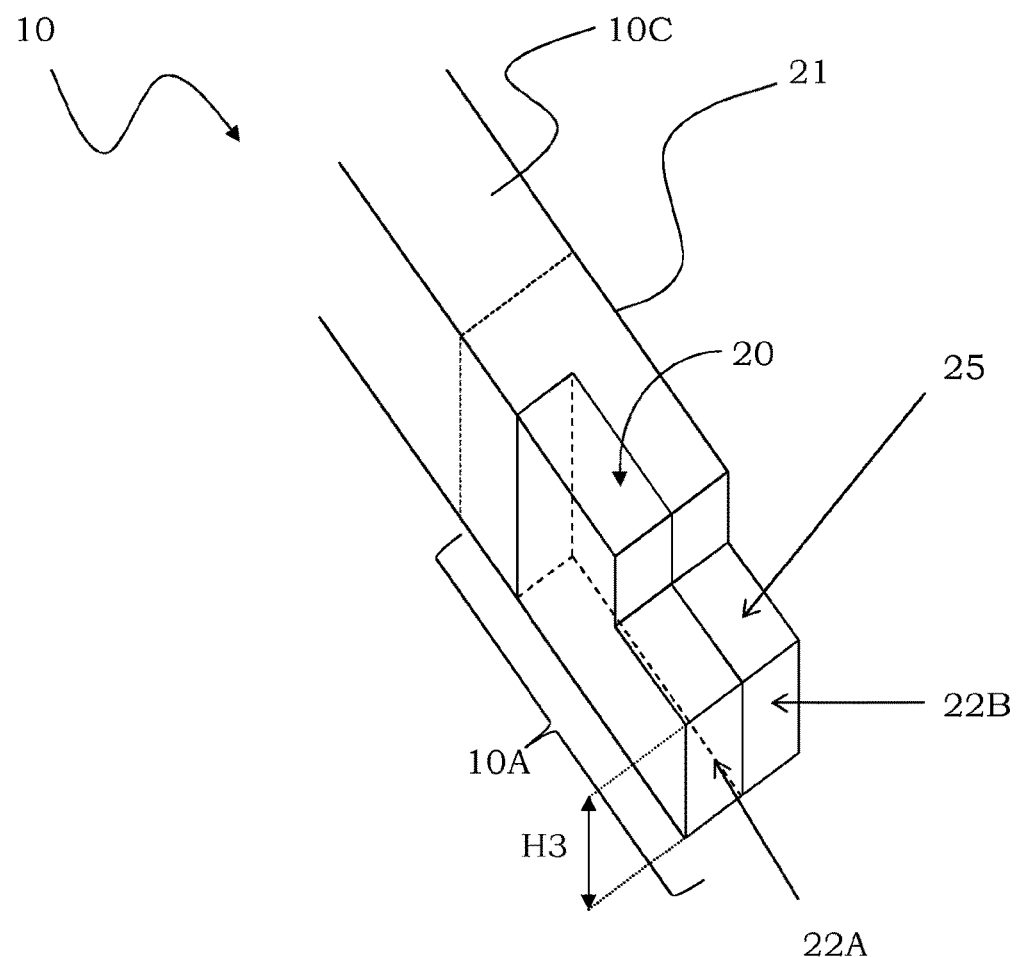

Referring to a further alternative embodiment of FIG. 5, the insert 20 and the section 21 have a lowered portion 25, apt to reduce the area of contact area 22 of the contact probe 10. In this case, it is possible to use contact probes 10 with cross-section having an area greater than the contact area 22, the latter being for example bound, in particular limited, to the dimensions of the contact pads of the device to be tested or by the scrub which the first abutting surface 20A of the contact probe 10 perform on such pads.

In the presence of the lowered portion 25, the contact area 22 has a height H3 less than the height of the contact probe 10. In particular, the height H3 of the contact area 22 is equal to 20%-80% of the height H of the contact probe 10, preferably equal to 50%. More particularly, the height H3 can have a value ranging from 3 μm to 50 μm.

Figure 6A:
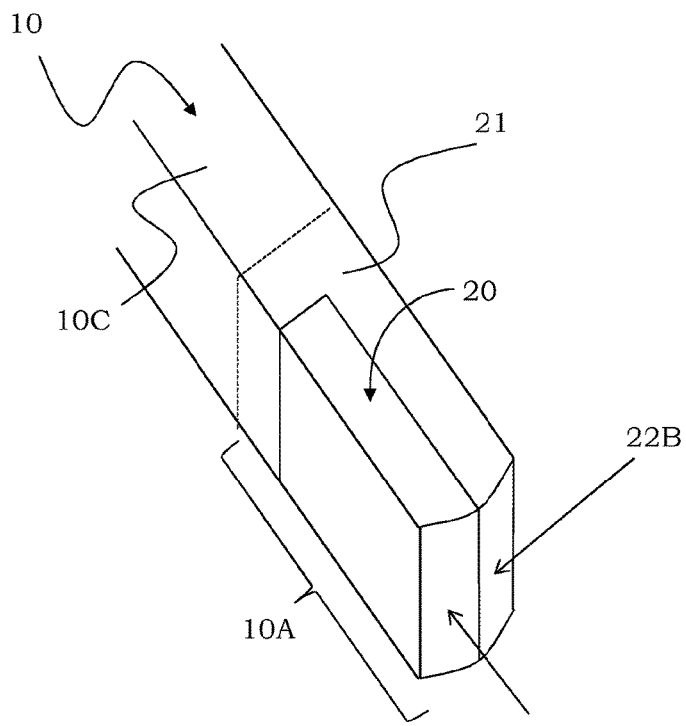
Figure 6B:
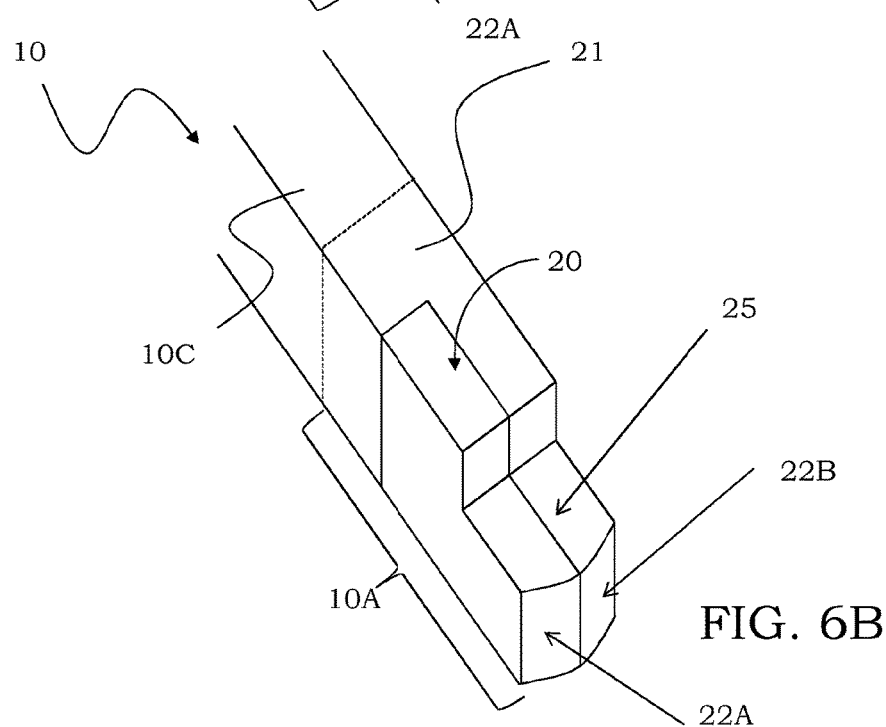

It is also possible to subject the contact probe 10, in particular its end portion 10A, to a lapping operation, in order to sharpen or at least round the contact area 22, as schematically illustrated in FIGS. 6A and 6B in the case of a contact probe 10 including an insert 20 having a height H1 equal to the height H of the contact probe 10 (referring to FIG. 6A) and also having a lowered portion 25 (referring to FIG. 6B).

In this case, the free end surface 22A of the insert 20 and the free end surface 22B of the section 21 forming the contact area 22 have a curvilinear shape, due to the lapping operation.

It is emphasized that such a lapping operation can be carried out at the end of the manufacture of the contact probes and/or of their inclusion in the respective testing head; it is also possible to perform one or more lapping operations of the end portions of the contact probe 10 during the life of the testing head in which the probes are inserted, for example in order to "renew" the rounded or sharp shape of the end portion thereof and also in order to remove possible impurities which may have accumulated at this portion.

Figure 6C:
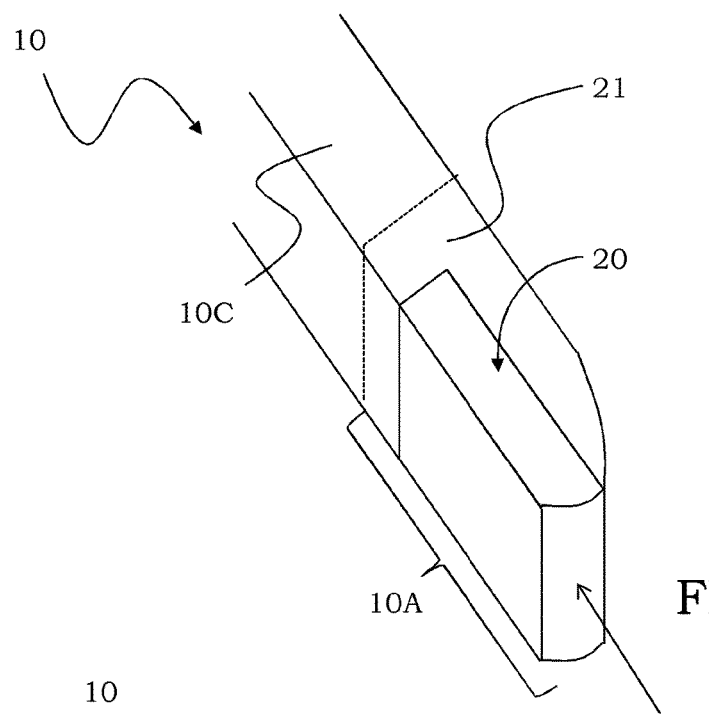
Figure 6D:
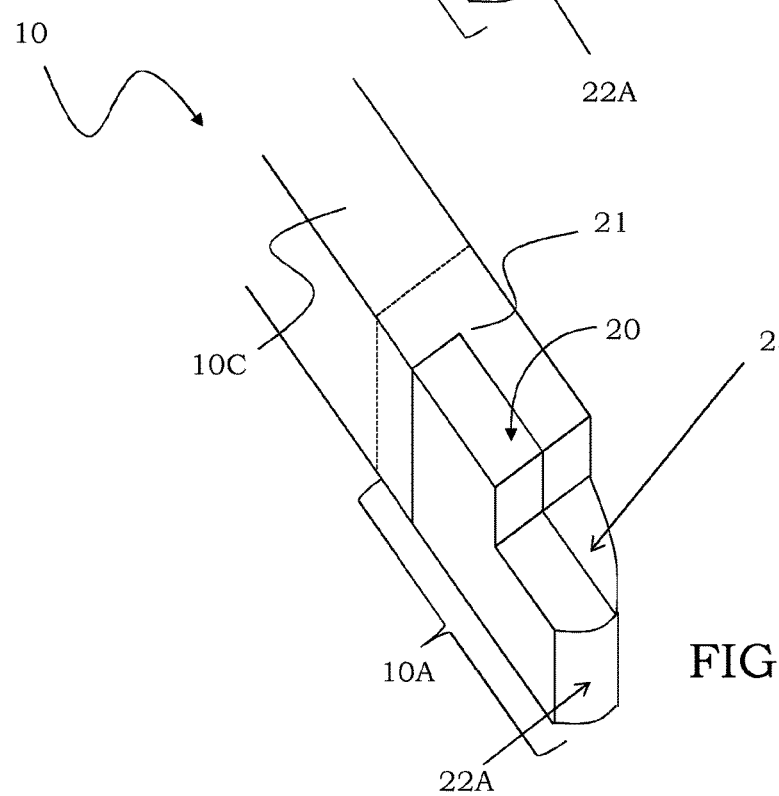

Referring to a further alternative embodiment of FIG. 6C, the lapping operation is able to make the section 21 thinner in correspondence of the insert 20, in particular by substantially canceling the area of the free end surface 22B of the section 21 in correspondence of the contact area 22, which thus results to be formed only by the free end surface 22A of the insert 20. The end portion 10A can comprise also in this case a lowered portion 25, as schematically shown in the embodiment of FIG. 6D.

Suitably, due to the support realized by the section 21, it is possible to realize the insert 20 with dimensions, in particular a length L, adapted to realize a "consumption" end portion 10A, the fragility of the material which such insert 20 is made of no longer constituting a problem, in particular a limit to the longitudinal dimensions of the insert 20 itself, so overcoming in this way the problems affecting the known probes.

Figure 7A:
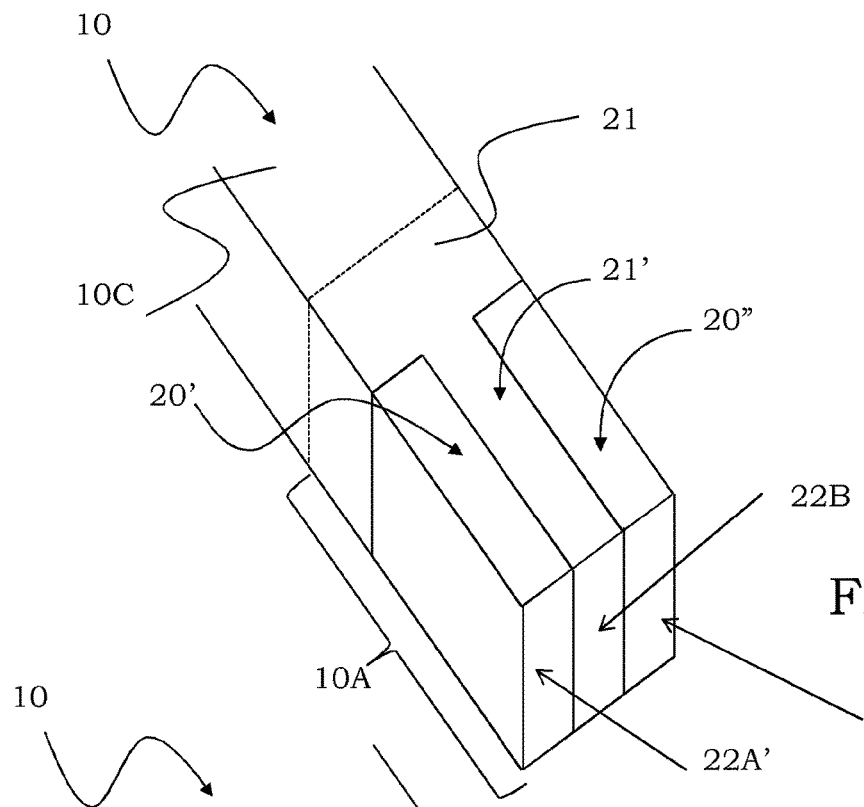
Figure 7B:
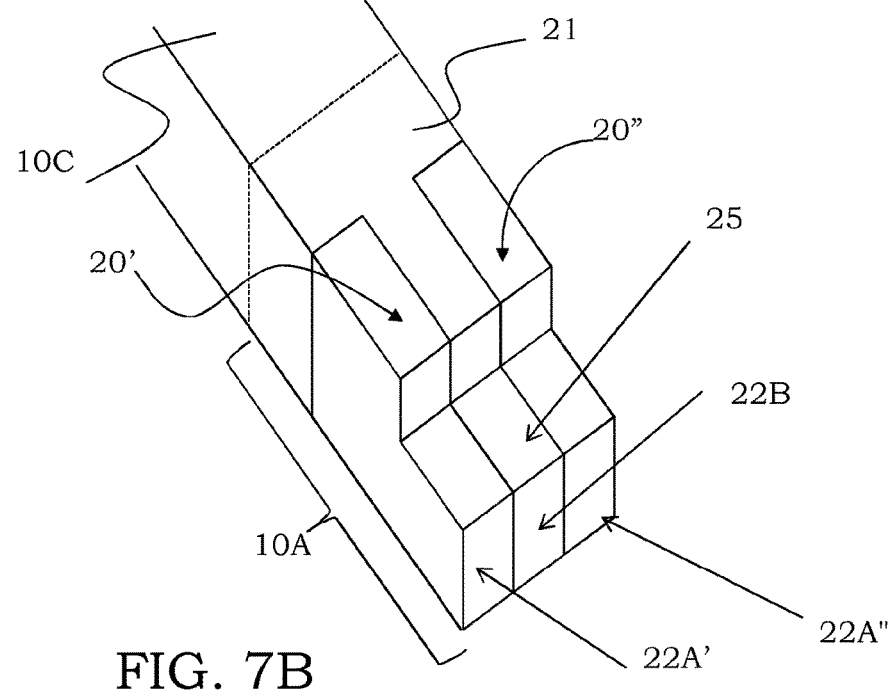

It is also possible to realize the end portion 10A so as to comprise at least a first insert 20' and a second insert 20", symmetrically arranged at the sides of a section 21 having a central thin plate portion 21' which realizes the support for both inserts, referring to the embodiment of FIG. 7A. Even in such a case, the end portion 10A of the contact probe 10 can also comprise a lowered portion 25, referring to the embodiment of FIG. 7B.

Furthermore, it is possible to realize a reduced thin plate portion 21" of the section 21, in particular having a height H4 less than the height H of the probe.

The height H4 of the reduced thin plate portion 21" is equal to 20%-80% of the height H of the contact probe 10, preferably equal to 50%. More particularly, the height H4 can have a value ranging from 3 μm to 50 μm.

Figure 8:
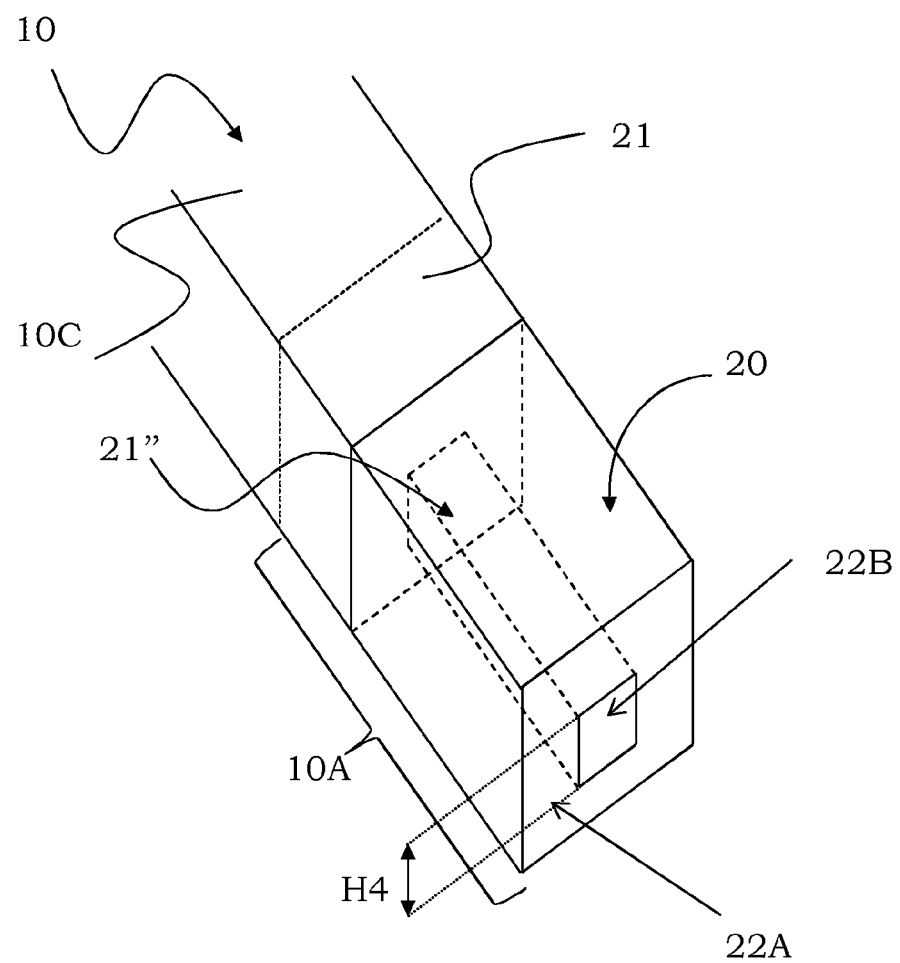

Referring to the embodiment of FIG. 8, the reduced thin plate portion 21" is positioned centrally and completely surrounded by the insert 20, which in this case is substantially crown-shaped. It is also possible to realize the reduced thin plate portion 21" so that it has at least one emerging surface on a face of the contact probe 10. In this case, the insert 20 is substantially U-shaped, so as to surround the thin plate portion 21" on three sides. Furthermore, the reduced thin plate portion 21" can be realized at one corner of the contact probe 10, surrounded by an insert 20 which is substantially L-shaped.

Also the inserts of the embodiments of FIGS. 5, 6A-6D and 7A-7B can be positioned differently from those illustrated by way of example in the Figures, in particular according to the alternative embodiments illustrated in FIGS. 4A-4C.

Obviously, it is also possible to provide the embodiments of FIGS. 4A-4C, 5, 6A-6D and 7A-7B with a coating layer, too, which extends in correspondence of the end portion 10A, in order to coat at least the section 21 and the insert 20, as well as an adhesion film arranged between the insert 20 and the section 21.

Figure 9:
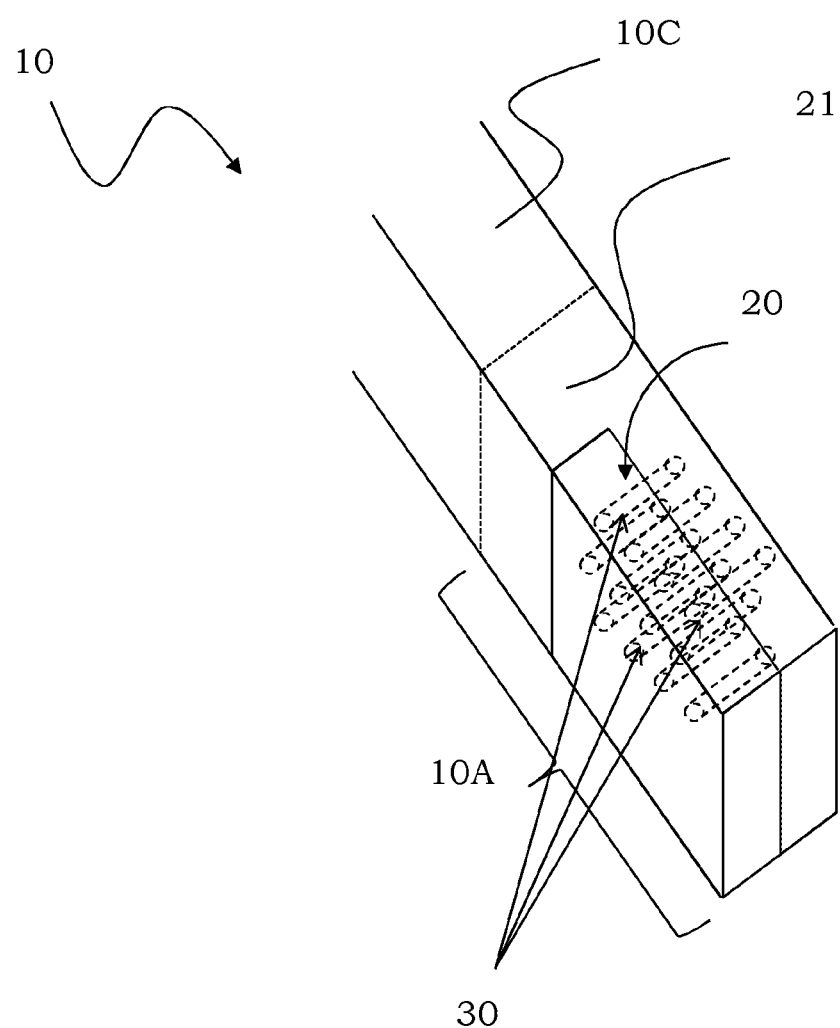

Finally, according to a further alternative embodiment of FIG. 9, the contact probe 10 can comprise, between the insert 20 and the section 21, at least one material bridge 30, suitably a plurality of material bridges 30, extending from inside the insert 20 into the section 21.

More in particular, the material bridges 30 can be realized by means of the first conductive material, which the insert 20 is made of, and are apt to improve the hold of the insert itself onto the section 21.

It is possible to make these material bridges by means of blind holes suitably filled with the first conductive material.

Finally, it is possible to coat the whole contact probe 10 with an outer layer apt to protect the contact probe 10 from corrosive agents, in particular at the end portion 10A thereof.

A testing head includes a plurality of probes of the type of the contact probe 10 according to the disclosure. In particular, such a testing head could comprise an upper guide and a lower guide in spaced relation to each other to define an air gap and provided with respective upper and lower guide holes wherein the contact probes slide.

Alternatively, the testing head could comprise a plate-shaped support, in particular a ceramic one, to which the plurality of contact probes is fixedly fastened at the head of the probes themselves, while the tips of the probes freely protrude from the plate-shaped support so as to abut onto a corresponding plurality of contact pads of a device to be tested.

In essence, the contact probe 10, which is provided with an insert 20 made of a material having a greater hardness than the material forming the rest of the contact probe 10, has an improved contact with the pads of a device to be tested or of a space transformer and also allows to realize an end portion 10A having dimensions adapted to provide a "consumption" tip, the structure of the section 21 providing the proper support of the insert 20 due to its anchoring in correspondence of at least two abutting surfaces of the insert 20 and of the section 21, facing and in contact with each other.

It is noted that the insert 20, which is made of the first conductive material, also allows to penetrate possible oxide layers being on the pads of the device to be tested, the section 21 that is made of the second conductive material providing for the actual contact.

From the foregoing it will be appreciated that, although specific embodiments of the disclosure have been described herein for purposes of illustration, various modifications may be made without deviating from the spirit and scope of the disclosure.

The invention claimed is:

1. A contact probe of a testing head of a testing apparatus of electronic devices comprising:
   first and second end portions adapted to contact respective contact pads; and
   a body extended in a longitudinal direction between the first and second end portions,
   wherein the first end portion comprises an insert made of a first conductive material having a hardness greater than a second conductive material making the contact probe,
   the insert being supported by a section of the first end portion made of the second conductive material, and
   the section of the first end portion being shaped in a complementary way with respect to the insert and having respective abutting surfaces facing and adhering to respective abutting surfaces of the insert.

2. The contact probe of claim 1, wherein the first conductive material is a metal or metal alloy chosen from rhodium, platinum, iridium or a metal alloy thereof or a palladium-cobalt alloy, a palladium-nickel alloy or a nickel-phosphorus alloy.

3. The contact probe of claim 1, wherein the second conductive material is a metal or metal alloy chosen from nickel or a metal alloy thereof, chosen from nickel-manganese, nickel-cobalt or nickel-tungsten alloys, copper or an alloy thereof, palladium or an alloy thereof.

4. The contact probe of claim 1, wherein the insert and the section have respective free end surfaces, forming a contact area of the contact probe.

5. The contact probe of claim 4, wherein the insert comprises at least one first abutting surface arranged at a bottom of the insert along a longitudinal direction of the contact probe, at an opposite position with respect to the contact area, and at least one lateral second abutting surface along a transversal direction perpendicular to the longitudinal direction, the first and second abutting surfaces of the insert facing and contacting respectively first and second abutting surfaces of the section.

6. The contact probe of claim 1, wherein the section comprises a thin plate portion for abutting the insert.

7. The contact probe of claim 1, wherein the insert has a height, in a transverse direction transverse to the longitudinal direction, corresponding to a height of the section of the contact probe in the transverse direction.

8. The contact probe of claim 1, wherein the insert has a height less than a height of the section of the contact probe.

9. The contact probe of claim 8, wherein the height of the insert is equal to 20%-80% of the height of the section of the contact probe.

10. The contact probe of claim 9, wherein the insert is arranged at one corner of the contact probe, or in correspondence of only one side of the contact probe or so as to be fully embedded in the contact probe.

11. The contact probe of claim 1, wherein the insert and the section have a lowered portion.

12. The contact probe of claim 11, wherein the insert and the section have respective free end surfaces, forming a contact area of the contact probe, and the lowered portion decreases a height of the contact area, in a transverse direction transverse to the longitudinal direction, to 20%-80% of a height of the contact probe in the transverse direction.

13. The contact probe of claim 1, further comprising at least one coating layer, extending in correspondence of the first end portion, in order to cover at least the section and the insert.

14. The contact probe of claim 13, wherein the coating layer is made of a conductive alloy having a low internal stress.

15. The contact probe of claim 1, further comprising at least one adhesion film on the abutting surfaces between the insert and the section.

16. The contact probe of claim 15, wherein the adhesion film is a metal or a metal alloy chosen from nickel or a nickel alloy or gold, silver, platinum or a metal alloy thereof.

17. The contact probe of claim 1, wherein the insert and the section have curvilinear free end surfaces, the free end surfaces forming a contact area of the contact probe.

18. The contact probe of claim 17, further comprising a contact area formed by the free end surface of the insert only.

19. The contact probe of claim 1, wherein the insert is a first insert and the first portion comprises a second insert, the first and second inserts being arranged symmetrically on sides of a thin plate portion of the section realizing a support for both the first and second inserts.

20. The contact probe of claim 19, wherein the thin plate portion has a height, in a transverse direction transverse to the longitudinal direction, less than a height of the contact probe in the transverse direction.

21. The contact probe of claim 1, wherein the section of the first end portion made of the second conductive material includes a thin plate portion arranged centrally and fully surrounded by the insert, which is crown-shaped, or the thin plate portion is arranged with a surface emerging from one surface of the contact probe with the insert being U-shaped, or the thin plate portion is arranged at one corner of the contact probe, surrounded by the insert, which is L-shaped.

22. The contact probe of claim 1, further comprising at least one material bridge extending into the insert and the section.

23. The contact probe of claim 22, wherein the material bridge is made of the first conductive material.

24. The contact probe of claim 1, wherein the insert has a length along the longitudinal direction between 10 μm and 1000 μm.

25. A contact probe of a testing head of a testing apparatus of electronic devices comprising:
   first and second end portions adapted to contact respective contact pads;
   a body extended in a longitudinal direction between the respective end portions and having a height in an orthogonal direction orthogonal to the longitudinal direction; and
   an insert positioned into the first end portion and supported by a section of the first end portion,
   the section of the first end portion is shaped in a complementary way with respect to the insert and has respective abutting surfaces facing and adhering to respective abutting surfaces of the insert,
   wherein the insert is made of a first conductive material and the contact probe, the first end portion and the section thereof are made of a second conductive material, the first conductive material having a hardness being greater than a hardness of a second conductive material; and
   the insert and the section have respective free end surfaces forming a contact area of the contact probe.

26. The contact probe of claim 25, wherein the first conductive material is a metal or metal alloy chosen from rhodium, platinum, iridium or a metal alloy thereof or a palladium-cobalt alloy, a palladium-nickel alloy or a nickel-phosphorus alloy.

27. The contact probe of claim 25, wherein the second conductive material is a metal or metal alloy chosen from nickel or a metal alloy thereof, chosen from nickel-manganese, nickel-cobalt or nickel-tungsten alloys, copper or an alloy thereof, palladium or an alloy thereof.

28. The contact probe of claim 25, wherein the insert comprises at least one first abutting surface arranged at a bottom of the insert along a longitudinal direction of the contact probe, at an opposite position with respect to the contact area, and at least one second lateral abutting surface along a transversal direction perpendicular to the longitudinal direction, the first and second abutting surfaces of the insert being facing and contacting respectively first and second abutting surfaces of the section.

29. The contact probe of claim 25, wherein the section comprises a thin plate portion for abutting the insert.

30. The contact probe of claim 25, wherein the insert has a height in the orthogonal direction that is chosen so as:
   to correspond to the height of the contact probe and particularly of the section thereof; or
   to be lower than the height of the contact probe and particularly of the section thereof: or
   to be equal to 20%-80% of the height of the contact probe and particularly of the section thereof.

31. The contact probe of claim 30, wherein the insert is arranged:
   at one corner of the contact probe, or
   in correspondence of only one side of the contact probe, or
   fully embedded in the contact probe.

32. The contact probe of claim 25, wherein the insert and the section of the first end portion have a lowered portion that decreases a height of the contact area to 20%-80% of the height of the contact probe.

33. The contact probe of claim 25, further comprising at least one coating layer, extending in correspondence of the first end portion, in order to cover at least the section and the insert and being made of a conductive alloy having a low internal stress.

34. The contact probe of claim 25, further comprising at least one adhesion film on the abutting surfaces between the insert and the section being a metal or a metal alloy chosen from nickel or a nickel alloy or gold, silver, platinum or a metal alloy thereof.

35. The contact probe of claim 25, wherein the insert is a first insert and the contact probe comprises a second insert, the first and second inserts being arranged symmetrically on sides of a thin plate portion of the section realizing a support for both the first and second inserts.

36. The contact probe of claim 35, wherein the section comprises a thin plate portion for abutting the insert and the thin plate portion has a height less than the height of the contact probe and is arranged:
   centrally and fully surrounded by the insert, which is crown-shaped, or
   with a surface emerging from one surface of the contact probe, the insert being U-shaped, or
   at one corner of the contact probe, surrounded by the insert, which is L-shaped.

* * * * *